(12) United States Patent
Kwak et al.

(10) Patent No.: US 9,275,903 B2
(45) Date of Patent: Mar. 1, 2016

(54) METHOD OF MANUFACTURING SEMICONDUCTOR DEVICE SUBSTRATE WITH CRYSTAL STRUCTURE REFORMATION REGIONS

(71) Applicant: Samsung Electronics Co., Ltd., Suwon-Si, Gyeonggi-Do (KR)

(72) Inventors: Byoung-Soo Kwak, Seoul (KR); Youngsu Kim, Hwaseong-si (KR); Sangwook Park, Hwaseong-si (KR); Taeje Cho, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/488,883

(22) Filed: Sep. 17, 2014

(65) Prior Publication Data

US 2015/0140785 A1 May 21, 2015

(30) Foreign Application Priority Data

Nov. 20, 2013 (KR) .......................... 10-2013-0141561

(51) Int. Cl.
| | | |
|---|---|---|
| *H01L 21/78* | (2006.01) | |
| *H01L 21/02* | (2006.01) | |
| *H01L 21/268* | (2006.01) | |
| *H01L 21/683* | (2006.01) | |
| *H01L 23/544* | (2006.01) | |

(52) U.S. Cl.
CPC .......... *H01L 21/78* (2013.01); *H01L 21/02013* (2013.01); *H01L 21/268* (2013.01); *H01L 21/6835* (2013.01); *H01L 23/544* (2013.01); *H01L 2221/6834* (2013.01); *H01L 2221/68327* (2013.01); *H01L 2223/54493* (2013.01); *H01L 2924/0002* (2013.01)

(58) Field of Classification Search
CPC .................. H01L 2924/0002; H01L 2924/00; H01L 21/76254; H01L 21/78; H01L 23/562; H01L 23/585; H01L 31/03921; H01L 31/068; H01L 31/0687; H01L 31/1804; Y02E 10/544; Y02E 10/547; Y10T 29/41
See application file for complete search history.

(56) References Cited

U.S. PATENT DOCUMENTS

| | | | |
|---|---|---|---|
| 5,789,302 | A | 8/1998 | Mitwalsky et al. |
| 7,741,196 | B2 | 6/2010 | Yip et al. |
| 8,309,435 | B2 | 11/2012 | Kaltalioglu et al. |
| 8,357,996 | B2 | 1/2013 | Mieczkowski et al. |
| 2007/0221613 | A1 | 9/2007 | Gutsche et al. |
| 2008/0179710 | A1 | 7/2008 | Yip et al. |
| 2011/0115058 | A1* | 5/2011 | Mieczkowski et al. ........ 257/620 |
| 2011/0244658 | A1 | 10/2011 | Kaltalioglu et al. |

(Continued)

FOREIGN PATENT DOCUMENTS

| | | |
|---|---|---|
| JP | 2005116948 A | 4/2005 |
| KR | 100804362 B1 | 2/2008 |

(Continued)

*Primary Examiner* — Michael Jung
*Assistant Examiner* — Charles R Peters
(74) *Attorney, Agent, or Firm* — Harness, Dickey & Pierce

(57) ABSTRACT

A method of manufacturing a semiconductor device include preparing an initial substrate including an edge region and a central region in which circuit patterns are formed, forming a reforming region in the edge region of the initial substrate, grinding the initial substrate to form a substrate, and cutting the substrate to form a semiconductor chip including each of the circuit patterns. A crystal structure of the reforming region is different from that of the initial substrate.

19 Claims, 18 Drawing Sheets

(56) References Cited

U.S. PATENT DOCUMENTS

2012/0319249 A1* 12/2012 Uchida et al. ............... 257/628
2014/0051233 A1* 2/2014 Agarwal et al. ............. 438/462

FOREIGN PATENT DOCUMENTS

| KR | 20120067642 A | 6/2012 |
|----|---------------|--------|
| KR | 20120068512 A | 6/2012 |

* cited by examiner

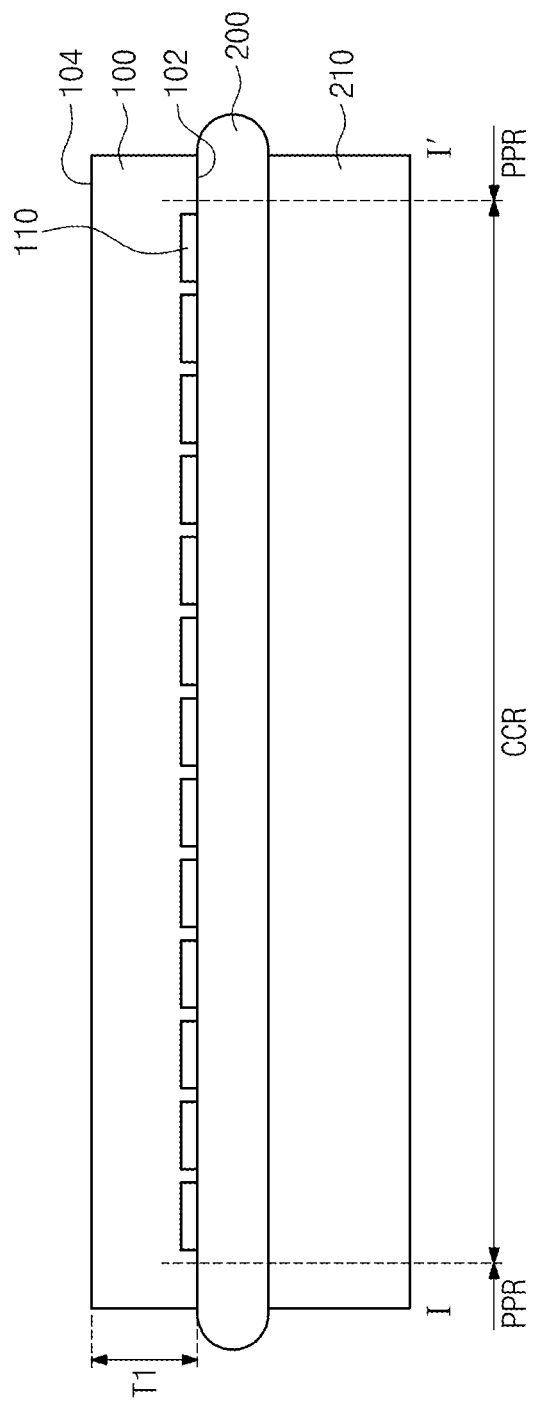

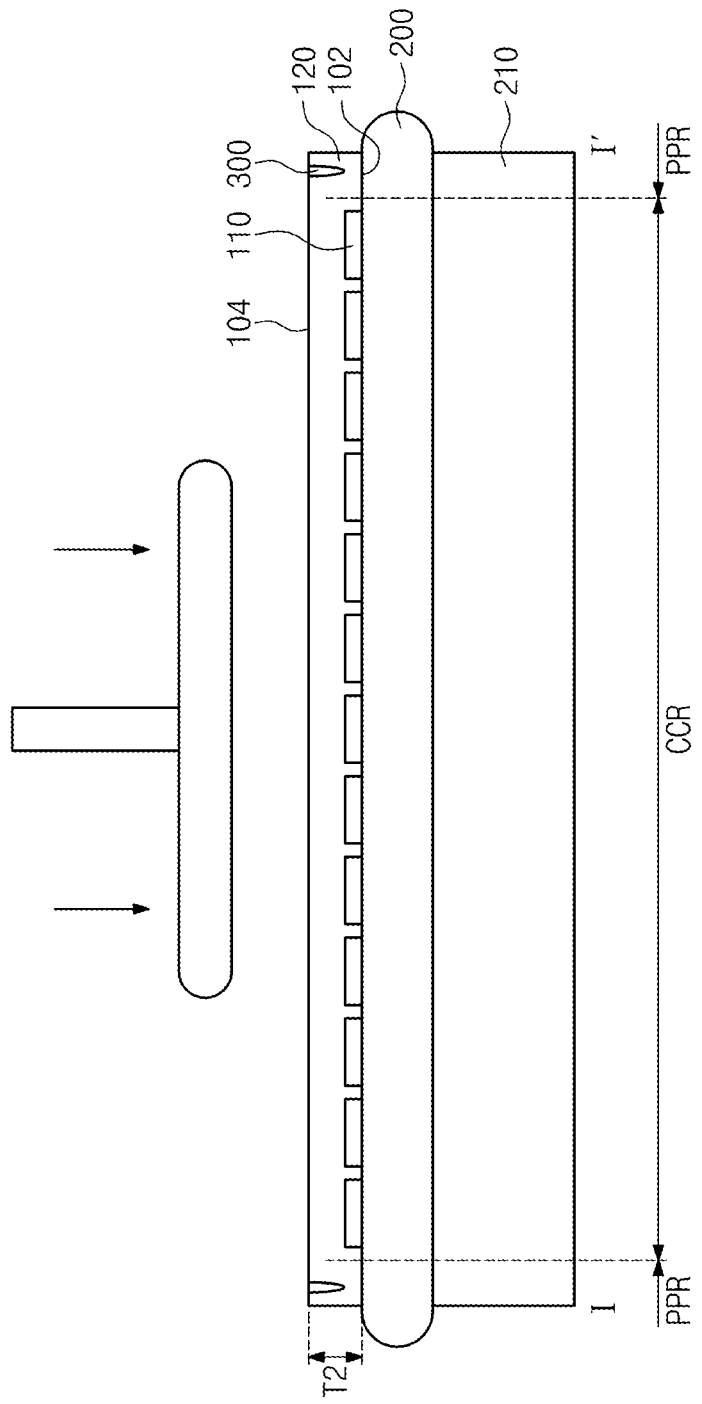

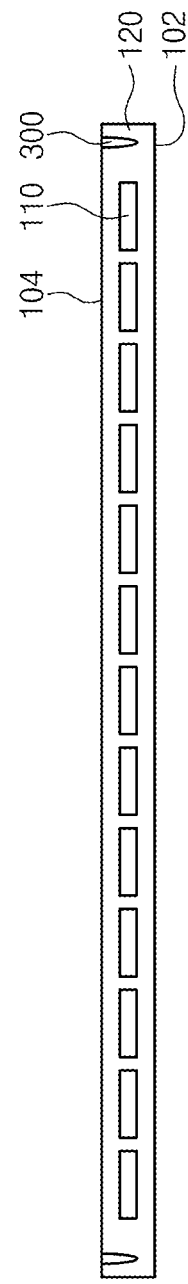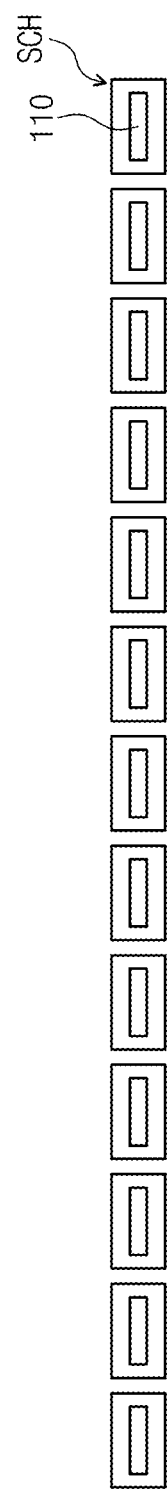

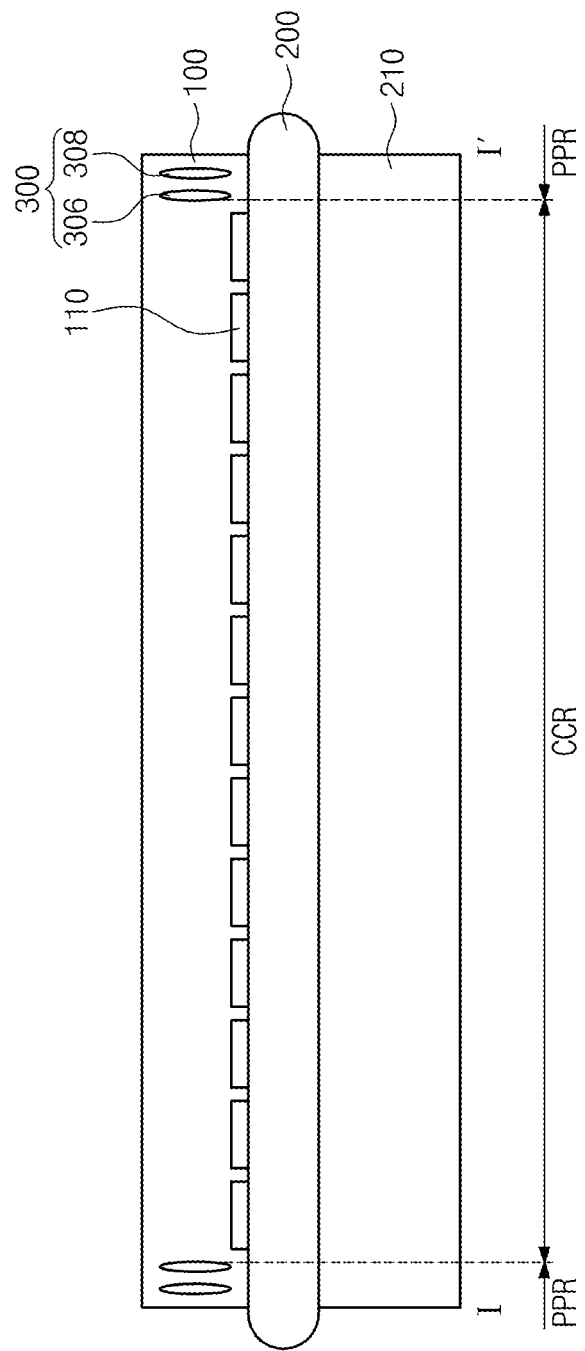

METHOD OF MANUFACTURING SEMICONDUCTOR DEVICE SUBSTRATE WITH CRYSTAL STRUCTURE REFORMATION REGIONS

CROSS-REFERENCE TO RELATED APPLICATIONS

This U.S. non-provisional patent application claims priority under 35 USC §119 to Korean Patent Application No. 10-2013-0141561, filed on Nov. 20, 2013, the entirety of which is hereby incorporated by reference.

BACKGROUND

The example inventive concepts described herein generally relate to methods of manufacturing semiconductor devices and, more particularly, to methods of manufacturing a semiconductor package.

Semiconductor devices are widely used in the electronics industry because of their small size, multi-functionality and/or low fabrication cost thereof. With the tremendous advance in the electronics industry in recent years, there has been a rapidly increasing demand for high density semiconductor devices. This demand is also growing in semiconductor packages. For example, the thickness of a semiconductor substrate including circuit patterns continues to decrease, and thin substrates are typically highly vulnerable to external impact.

SUMMARY OF THE INVENTION

Example embodiments of the inventive concept provide a method of manufacturing a semiconductor device.

In some example embodiments, the method may include preparing an initial substrate including an edge region and a central region, and circuit patterns formed in the circuit region, forming a reforming region in the edge region of the initial substrate, grinding the initial substrate to form a substrate, and cutting the substrate to form a semiconductor chip including each of the circuit patterns.

In at least one example embodiment, a crystal structure of the reforming region is different from a crystal structure of the initial substrate.

In at least one example embodiment, forming a reforming region in the edge region of the initial substrate may include irradiating a laser along the edge of the initial substrate.

In at least one example embodiment, the depth of the reforming region may be between about 70 percent and about 99 percent of the thickness of the initial substrate.

In at least one example embodiment, the reforming region may be exposed to a ground surface of the substrate.

In at least one example embodiment, forming a reforming region in the edge region of the initial substrate may include continuously or substantially continuously irradiating laser along the edge region of the initial substrate.

In at least one example embodiment, forming a reforming region in the edge region of the initial substrate may include discontinuously or intermittently irradiating a laser along the edge region of the initial substrate to form a plurality of patterns.

In at least one example embodiment, forming a reforming region in the edge region of the initial substrate may include irradiating laser along the edge region of the initial substrate to form a first pattern and irradiating a laser between the first pattern and the edge of the initial substrate to form a second pattern.

In at least one example embodiment, the initial substrate may include a notch, and forming a reforming region in the edge region of the initial substrate may include irradiating a laser to a portion adjacent to the notch of the initial substrate.

In at least one example embodiment, forming a reforming region in the edge region of the initial substrate may further include irradiating a laser along the edge region of the initial substrate.

BRIEF DESCRIPTION OF THE DRAWINGS

The example inventive concepts will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the example inventive concepts.

FIGS. 1A through 4A are top plan views illustrating a method of manufacturing a semiconductor device according to at least one example embodiment;

FIGS. 1B through 4B, FIG. 5, and FIG. 6 are cross-sectional views illustrating a method of manufacturing a semiconductor device according to at least one example embodiment;

FIGS. 7A through 7F are top plan views and a cross-sectional view illustrating reforming regions according to example embodiments.

DETAILED DESCRIPTION

Figure 1A:
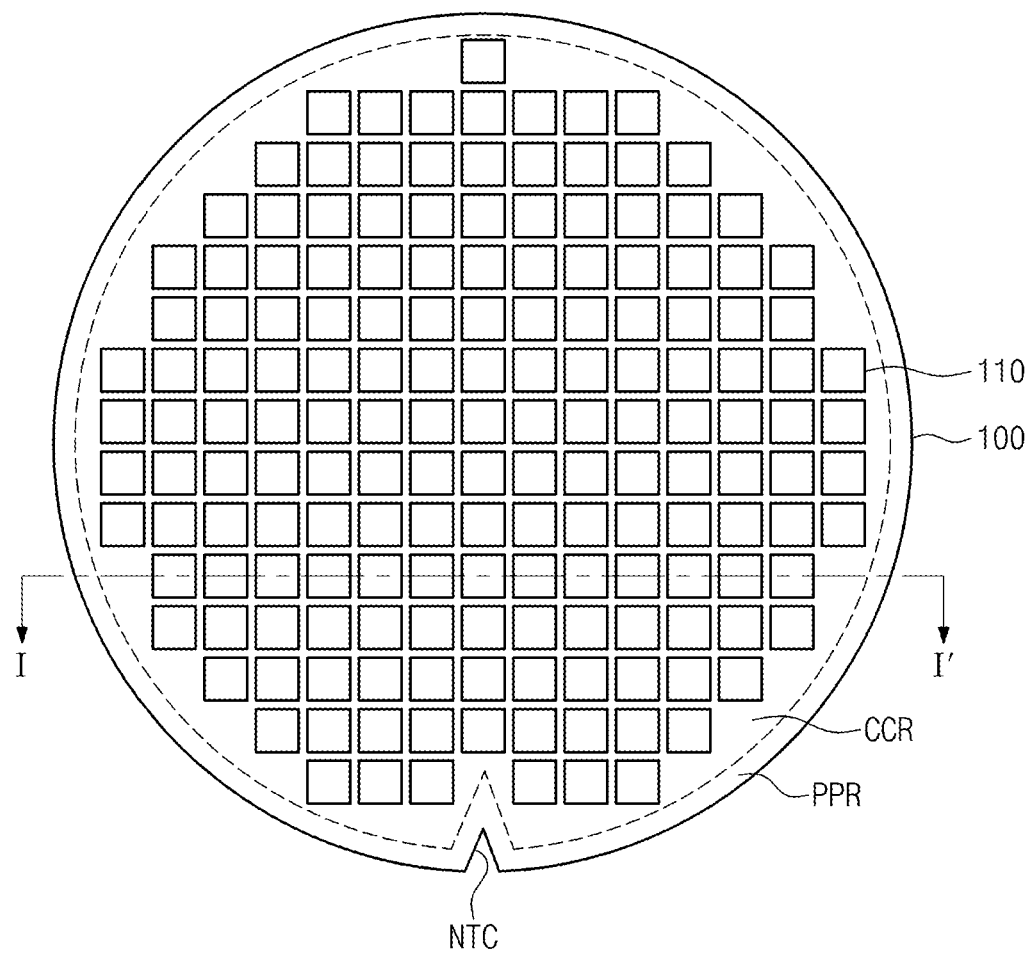

The advantages and features of the example inventive concept and methods of achieving them will be apparent from the following example embodiments that will be described in more detail with reference to the accompanying drawings. It should be noted, however, that the inventive concept is not limited to the following example embodiments, and may be implemented in various forms. Accordingly, the example embodiments are provided only to disclose the inventive concept and let those skilled in the art know the category of the inventive concept.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

Example embodiments will be described below with reference to cross-sectional views, which are example drawings of the invention. The example drawings may be modified by manufacturing techniques and/or tolerances. Accordingly, the example embodiments are not limited to specific configurations shown in the example drawings, and include modifications based on the example method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the example drawings exemplify specific shapes of regions in an element, and do not limit the invention. Though terms like a first, a second, and a third are used to describe various elements in various example embodiments of the inventive concept, the elements are not limited to these terms. These terms are used only to tell one element from another element. An example embodiment described and exemplified herein includes a complementary embodiment thereof.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concept will now be described more fully with reference to accompanying example drawings.

FIGS. 1A through 4A are top plan views illustrating a method of manufacturing a semiconductor device according to at least one example embodiment of the inventive concepts. FIGS. 1B through 4B, FIG. 5, and FIG. 6 are cross-sectional views illustrating a method of manufacturing a semiconductor device according to at least one example embodiment of the inventive concepts. FIGS. 1B through 4B are cross-sectional views taken along the line I-I' in FIG. 1A through 4A.

Figure 1B:
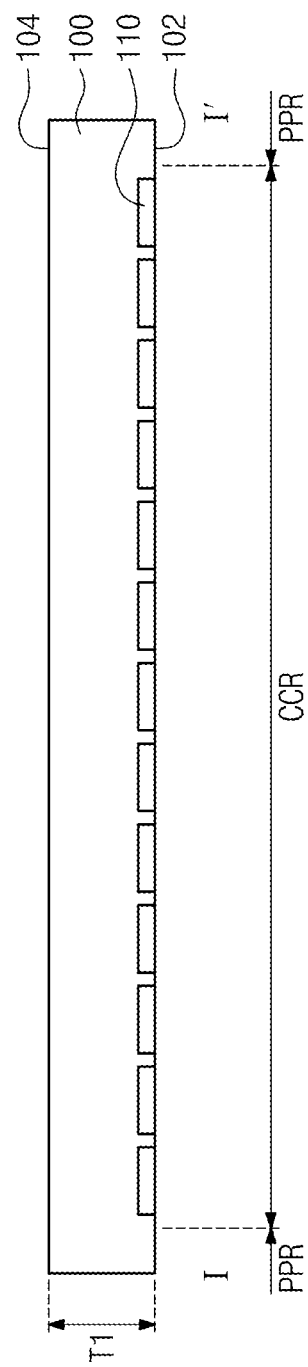

Referring to FIGS. 1A and 1B, an initial substrate 100 may be provided with circuit patterns 110.

According to at least one example embodiment, the initial substrate 100 may include silicon (Si), germanium (Ge) or silicon/germanium (Si/Ge). In an example embodiment of the inventive concept, if the initial substrate 100 includes silicon, the initial substrate 100 may be formed by growing a single-crystal silicon seed to form an ingot, and thinly cutting and processing the ingot. The accomplished initial substrate 100 may have substantially the same crystal structure as the single-crystal silicon seed. The initial substrate 100 may have a disc shape. The ingot is subjected to an orientation process, and a notch NTC or a flat zone may be formed at a determined position to understand crystal orientation of the ingot.

The initial substrate 100 may include a circuit region CCR in which the circuit patterns 110 are formed, and an edge region PPR surrounding the circuit region CCR. The circuit region CCR may be a central portion of the initial substrate 100.

According to at least one example embodiment, the circuit patterns 110 may be formed on the entire surface 102 of the initial substrate 100. An integrated circuit may include a memory circuit and a non-memory circuit. An example of the memory circuit may be a random access memory (RAM) or a nonvolatile memory. The non-memory circuit may include, for example, a memory control circuit, an application process circuit, a power supply circuit, a modem or radio frequency (RF) circuit, and the like.

In an example embodiment of the inventive concepts, the initial substrate 100 may have a first thickness T1.

The initial substrate 100 may be a bare wafer and have a first thickness T1.

Figure 2A:
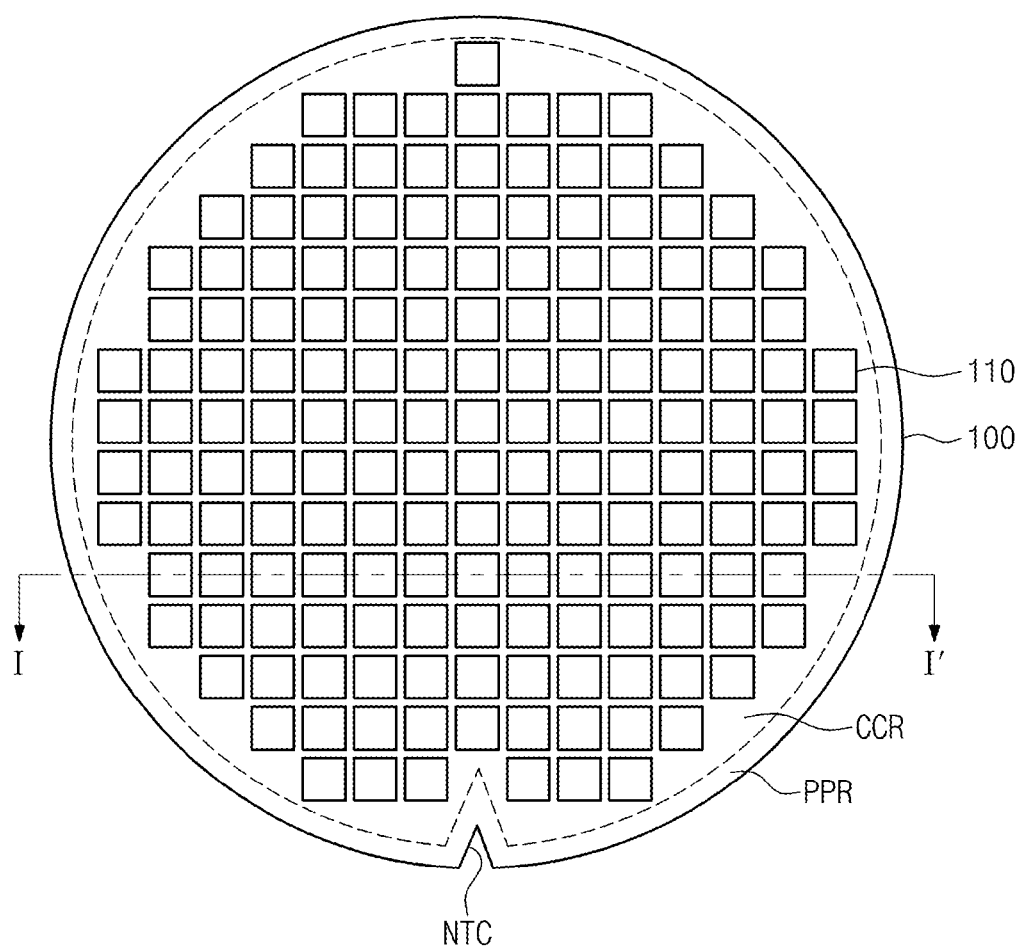

Referring to FIGS. 2A and 2B, a carrier substrate 210 may be attached to a substantial portion of, most of, or the entire surface 102 of the initial substrate 100 using an adhesive 200.

The carrier substrate 210 may reduce or alternatively suppress damage to the circuit patterns 110 formed on the surface 102 of the initial substrate 100 when moving the initial substrate 100 and processing the initial substrate 100.

Figure 3A:
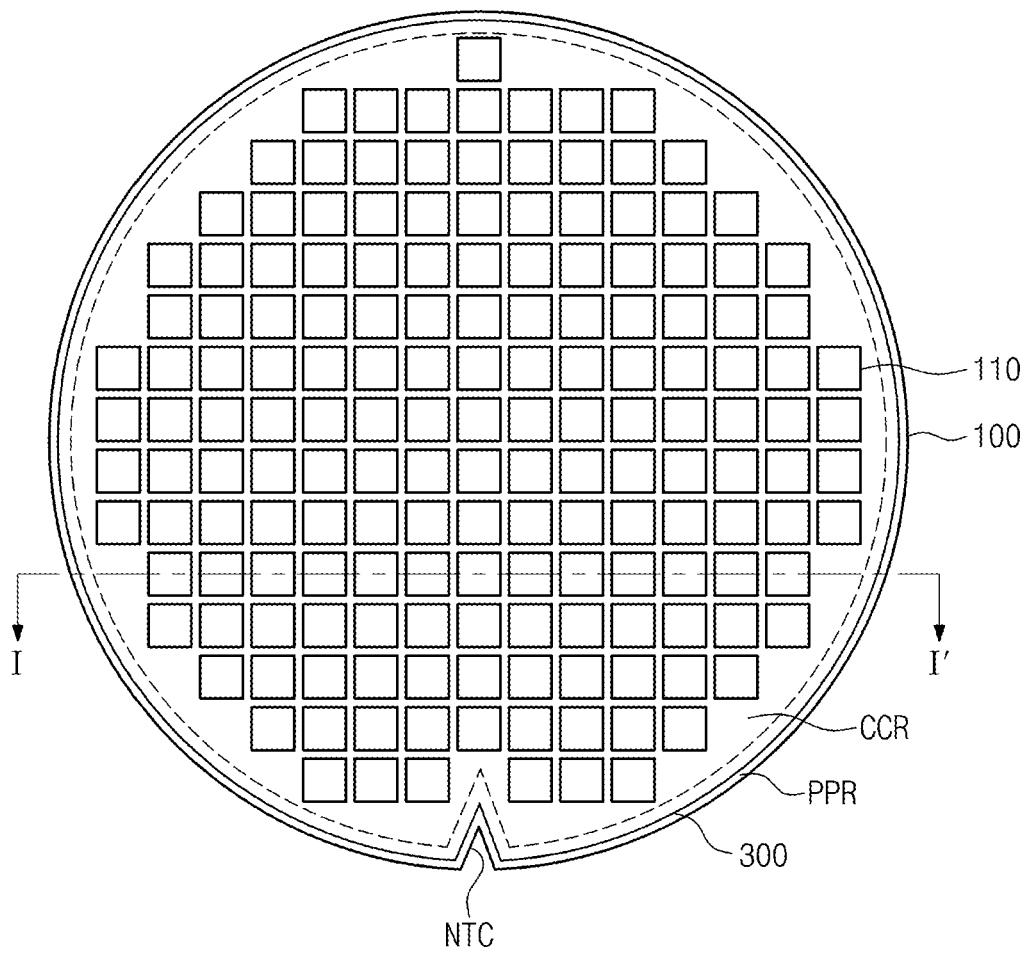
Figure 3B:
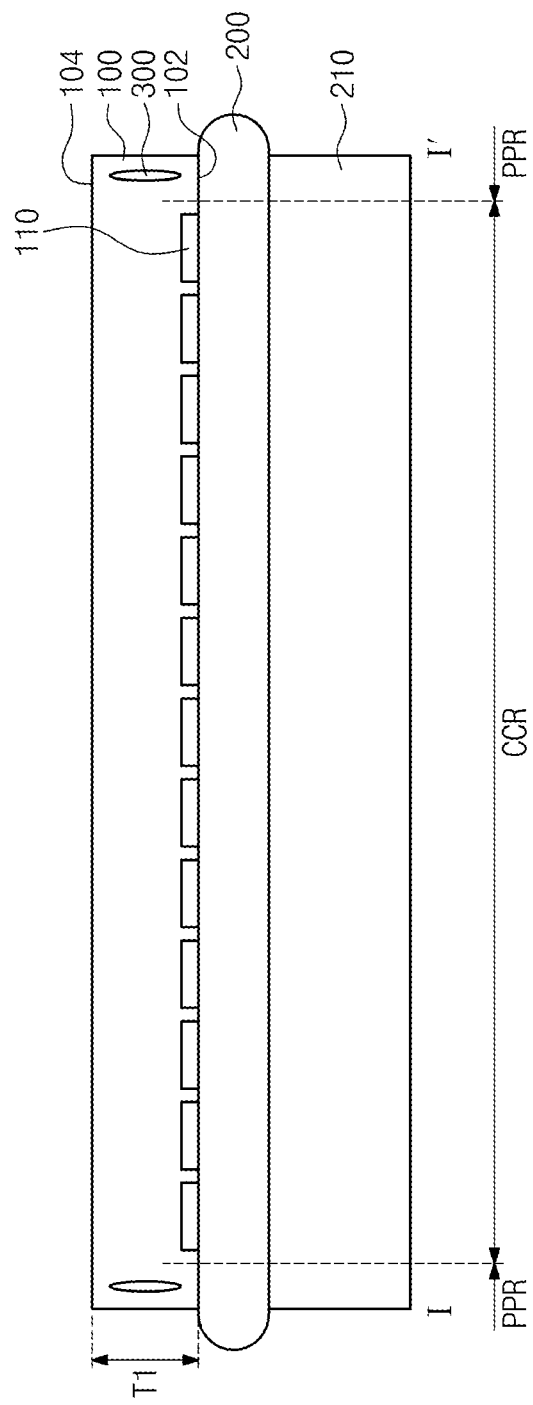

Referring to FIGS. 3A and 3B, a reforming region 300 may be formed in the edge region PPR by irradiating a laser on a back surface 104 of the initial substrate 100, according to at least one example embodiment.

The laser may be easily irradiated to a position that targets light amplification by stimulated emission radiation. Accordingly, the reforming region 300 may be formed at the target position in the initial substrate 100.

In an example embodiment of the inventive concepts, the depth of the reforming region 300 may be about equal to the depth of the initial substrate 100 remaining after a subsequent grinding process. For example, the depth of the reforming region 300 may be between about 70 percent and about 99 percent of the first thickness T1. The reforming region 300 may be spaced apart from the surface 102 of the initial substrate 100 by a desired, or alternatively predetermined distance and may be spaced apart from the back surface 104 of the initial substrate 100 by a desired, or alternatively predetermined distance.

In an example embodiment of the inventive concepts, the reforming region 300 may have a different crystal structure from an original crystal structure. More specifically, when the initial substrate 100 include single-crystal silicon, laser-irradiated silicon in the initial substrate 100 may be melted and recrystallized to have a different crystal structure than the crystal structure of the initial substrate 100.

In at least one example embodiment of the inventive concepts, the laser may be continuously or substantially continuously irradiated along the edge region PPR of the initial substrate 100. In another example embodiment of the inventive concepts, the laser may be discontinuously or intermittently irradiated along the edge region PPR of the initial substrate 100 to form a reforming region 300 including a plurality of patterns. In another example embodiment of the inventive concepts, the laser may be irradiated two or more times on many portions of the edge region PPR of the initial substrate 100. In another example embodiment of the inventive concepts, the laser may be irradiated to a specific portion of the edge region PPR of the initial substrate 100. For example, the specific portion may include a notch or a flat zone of the initial substrate 100.

Hereinafter, various example embodiments of the structure of the reforming region 300 will now be described below in detail.

Figure 4A:
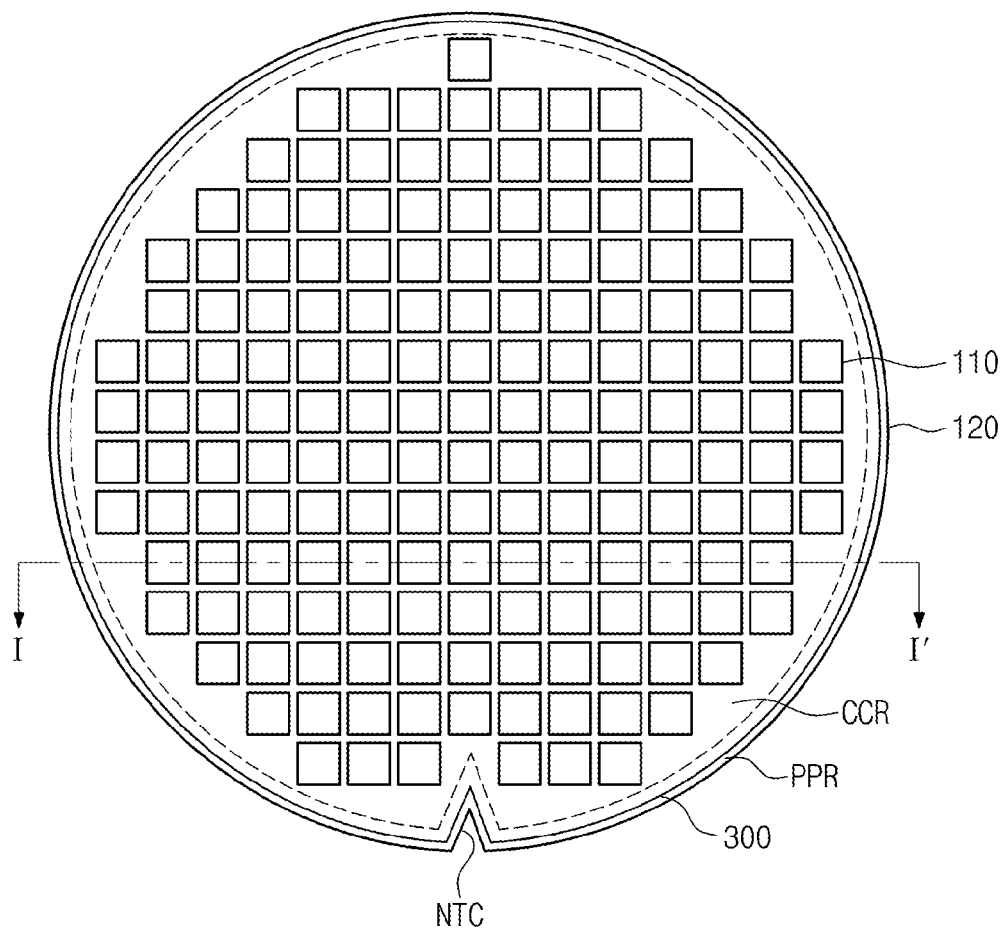

Referring to FIGS. 4a and 4B, the back surface 104 of the initial substrate 100 may be ground to form a substrate 120 having a second thickness T2 that may be smaller than the first thickness T1. The thickness T2 may be about 30 micrometers to about 50 micrometers, for example.

The grinding process may include a back lap process or a chemical mechanical polishing (CMP) process.

In an example embodiment of the inventive concepts, a portion of the reforming region 300 formed on the back surface 104 of the initial substrate 100 may be removed while the grinding process is performed. The reforming region 300 may be exposed to the back surface 104 of the substrate 120 having the second thickness T2.

The substrate 120 having the decreased thickness T2 may be highly vulnerable to external impact. Damage (e.g., chipping, cracking or swelling) of the substrate 120 may be easily caused by external physical impact. The damage may be applied from the edge region PPR to the inside of the substrate 120 along the crystal structure in the substrate 120 and may have an influence on the circuit patterns 110 in the substrate 120. In example embodiments of the inventive concepts, the reforming region 300 is formed along the edge of the substrate 120 to reduce or prevent external damage from transferring to the inside of the substrate 120.

Referring to FIG. 5, the adhesive 200 and the carrier substrate 210 may be separated from the substrate 120, according to at least one example embodiment.

Referring to FIG. 6, a semiconductor chip SCH including each of the circuit patterns 110 may be formed by cutting the substrate 120, according to at least one example embodiment. A semiconductor package may be formed by mounting the semiconductor chips SCH on a package substrate 120 such as a printed circuit board (PCB) 120 to form a semiconductor package.

Hereinafter, example structures of reforming regions will now be described below in detail.

Figure 7A:
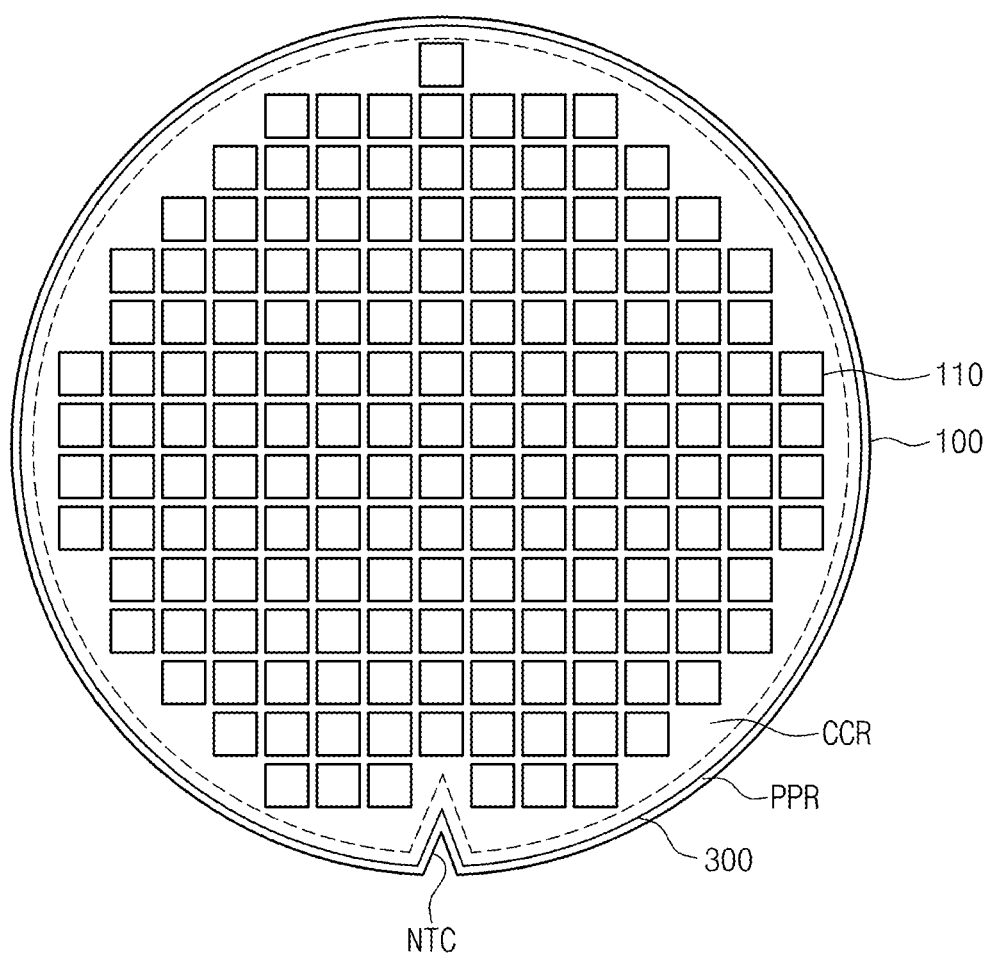

FIGS. 7A through 7F are top plan views and a cross-sectional view illustrating reforming regions according to example embodiments of the inventive concepts. FIG. 7E is a cross-sectional view taken along the line I-I' in FIG. 7D.

Referring to FIGS. 7A through 7F, a semiconductor substrate may include a notch NTC to display crystal orientation.

Referring to FIG. 7A, a reforming region 300 may be in the form of a closed curve that is continuously or substantially continuously formed along the edge region PPR of an initial substrate 100. As shown in the figure, the closed curve of the reforming region 300 may be in the form of a closed curve transformed according to the shape of a portion of the notch NTC. As previously set forth, the reforming region 300 may be formed by continuously or substantially continuously irradiating a laser along the edge region PPR of the initial substrate 100.

Figure 7B:
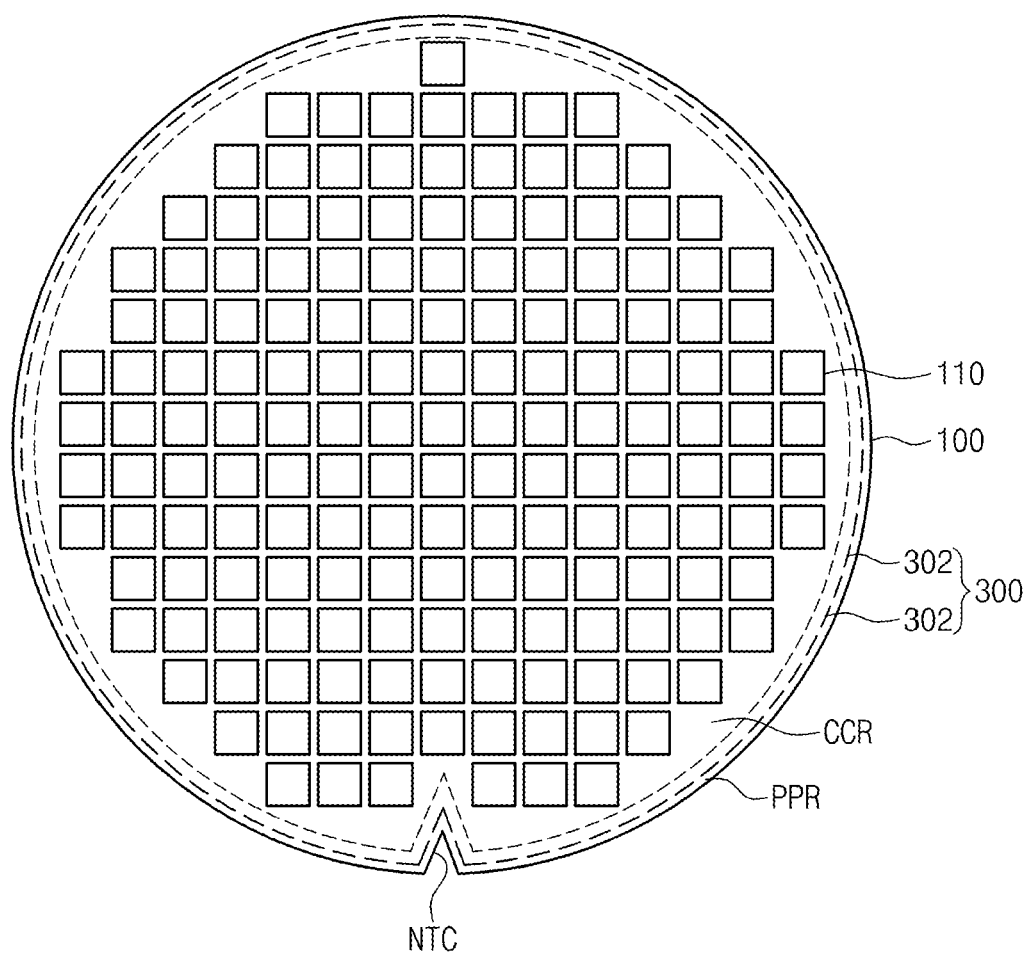

Referring to FIG. 7B, a reforming region 300 may include a plurality of patterns 302. The patterns 302 may be disposed to be spaced apart from each other along an edge region PPR of an initial substrate 100. As previously set forth, the reforming region 300 including the plurality of patterns 302 may be formed by discontinuously, intermittently or alternatively irradiating a laser along the edge region PPR of the initial substrate 100.

Figure 7C:
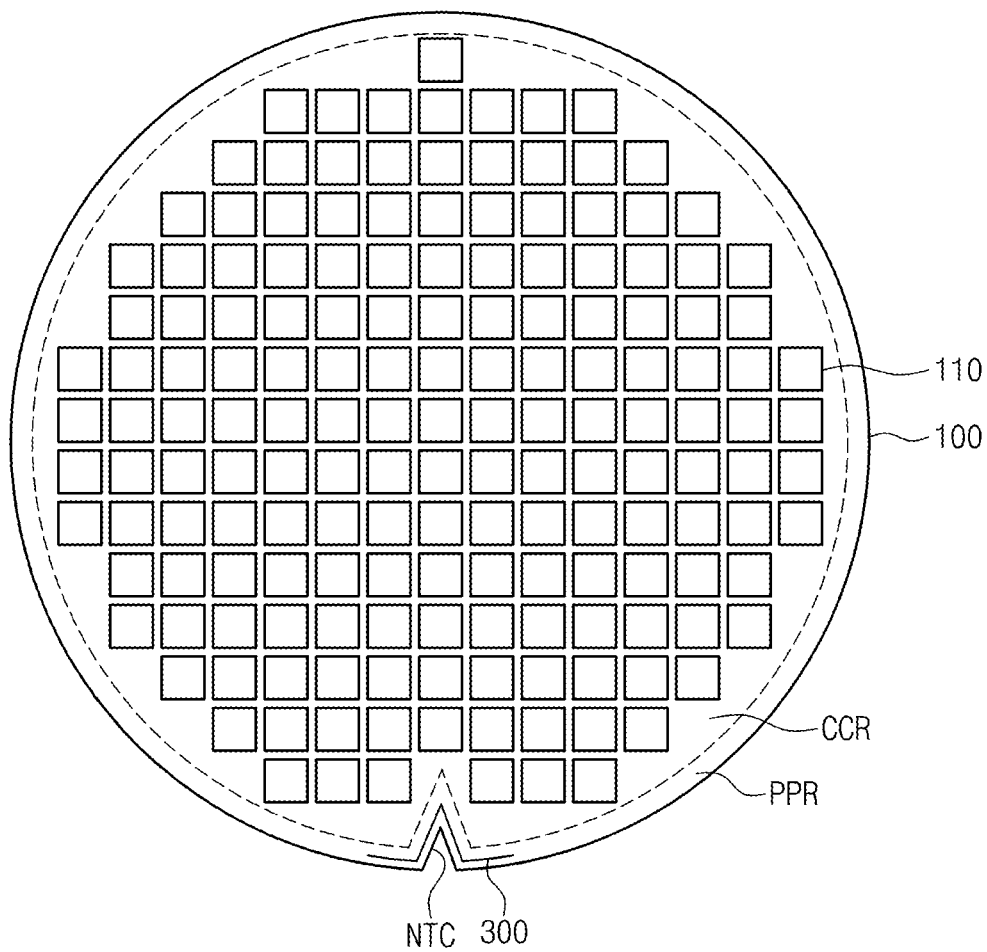

Referring to FIG. 7C, a reforming region 300 may be formed at a notch (NTC) portion of an initial substrate 100. As previously set forth, the reforming region 300 is formed to reduce or alternatively suppress a damage transferred by external impact. The notch (NTC) portion of the initial substrate 100 may be more vulnerable to the external impact. Thus, the damage to the notch (NTC) portion may be reduced or alternatively suppressed more effectively by selectively forming the reforming region 300 at the notch (NTC) portion. As previously set forth, the reforming region 300 may be formed by irradiating a laser to a specific portion of the edge region PPR of the initial substrate 100, i.e., the notch NTC of the initial substrate 100.

Figure 7D:
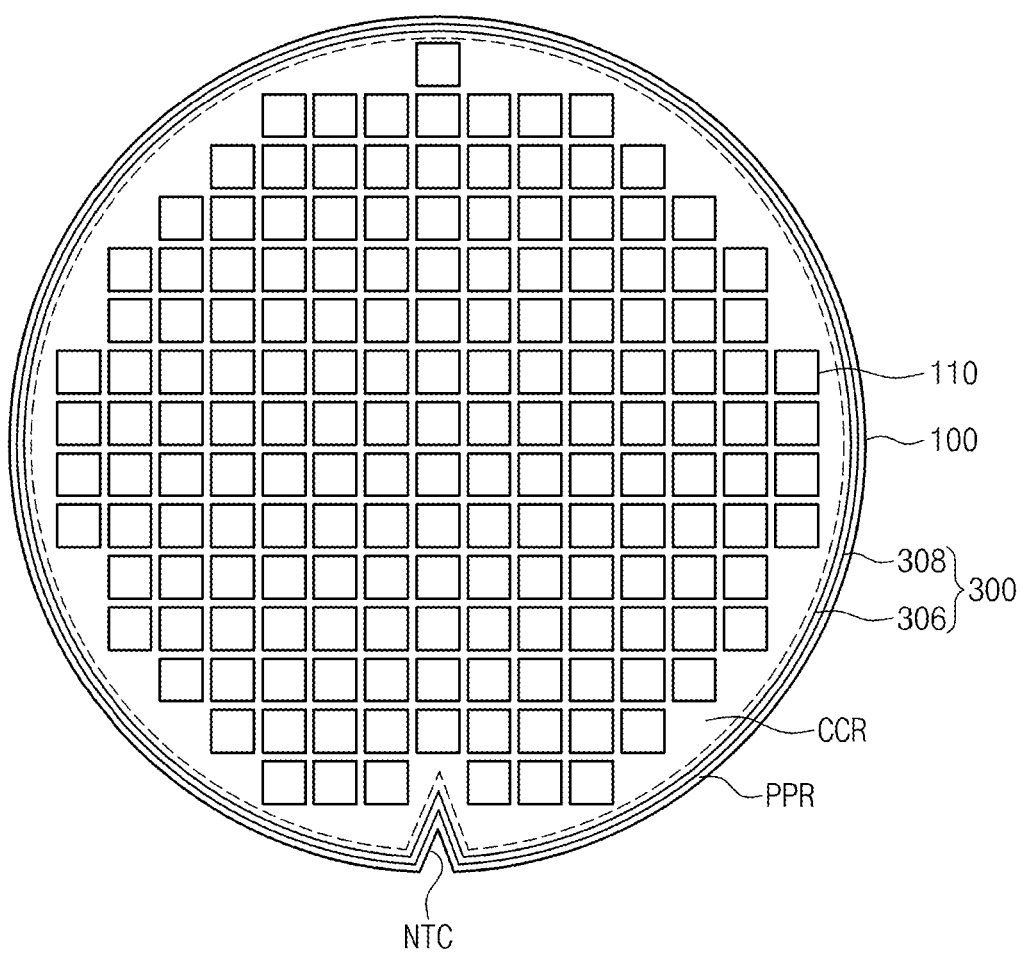

Referring to FIGS. 7D and 7E, a reforming region 300 may include a first pattern 306 and a second pattern 308. The first pattern 306 may be in the form of a closed curve that is continuously or substantially continuously formed along an edge region PPR of an initial substrate 100. The second pattern 308 may be disposed adjacent to the first pattern 306 and may be in the form of a closed curve that is continuously or substantially continuously formed along the edge region PPR of the initial substrate 100. The first pattern 306 and the second pattern 308 may be concentric to each other. As previously set forth, the reforming region 300 may include first and second patterns 306 and 308 that are formed by irradiating the laser two or more times on many positions of the edge region PPR of the initial substrate 100.

In an example embodiment of the inventive concepts, although not shown in detail, at least one of the first and second patterns 306 and 308 may include a plurality of patterns 302 as shown in FIG. 7B. If both the first and second patterns 306 and 308 include the plurality of patterns 302, the patterns 302 may be disposed to cross each other.

Although the reforming region 300 includes the two patterns 306 and 308 in this example embodiment, the number of patterns in the reforming region 300 is not limited to this example.

Figure 7F:
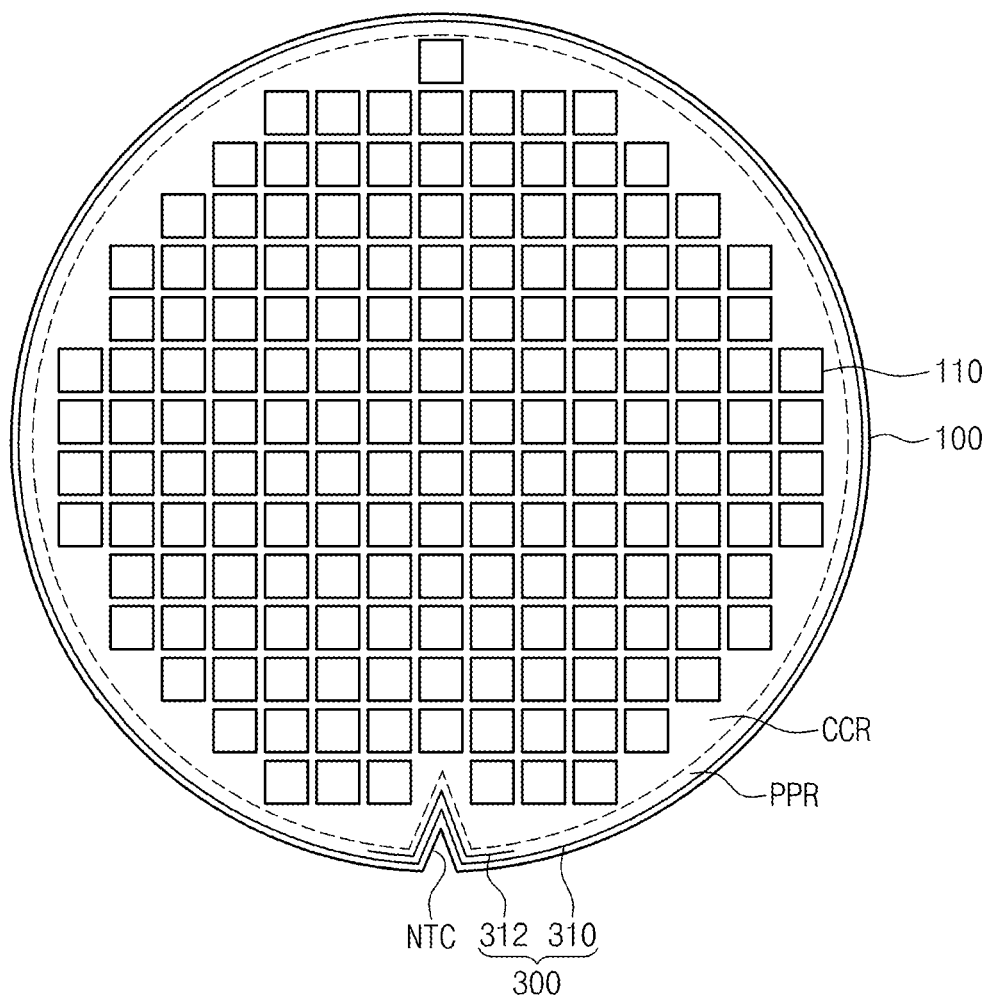

Referring to FIG. 7F, a reforming region 300 may include a first pattern 310 and a second pattern 312. The first pattern 310 may be in the form of a closed curve that is continuously or substantially continuously formed along an edge region PPR of an initial substrate 100. The second pattern 312 may be disposed adjacent to the first pattern 310 and may be formed at a notch (NTC) portion.

In this example embodiment, a second pattern 312 may be disposed between the first pattern 310 and circuit patterns 110. In an example embodiment, although not shown in the figure, the second pattern 312 may be disposed outside the first pattern 310. In another example embodiment, the first pattern 310 may include a plurality of patterns 302 as shown in FIG. 7B.

Figure 8A:
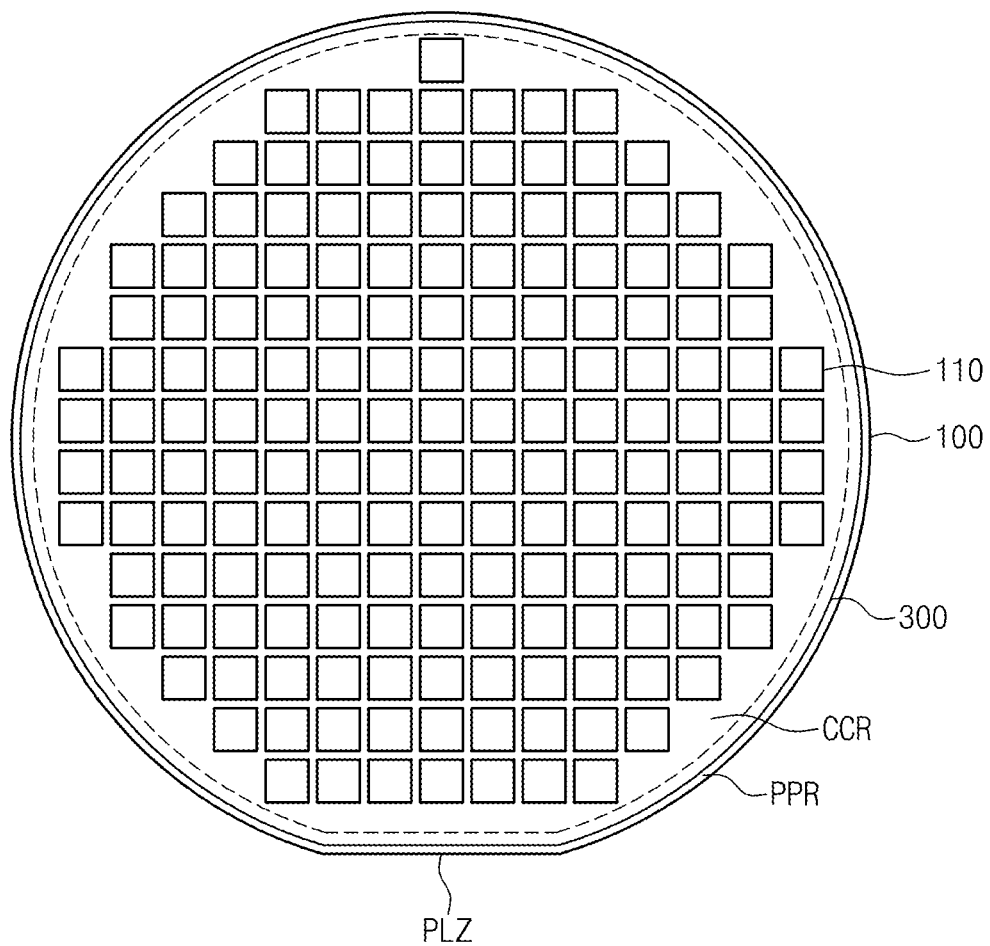
FIGS. 8A through 8C are top plan views illustrating reforming regions according to example embodiments.
Figure 8B:
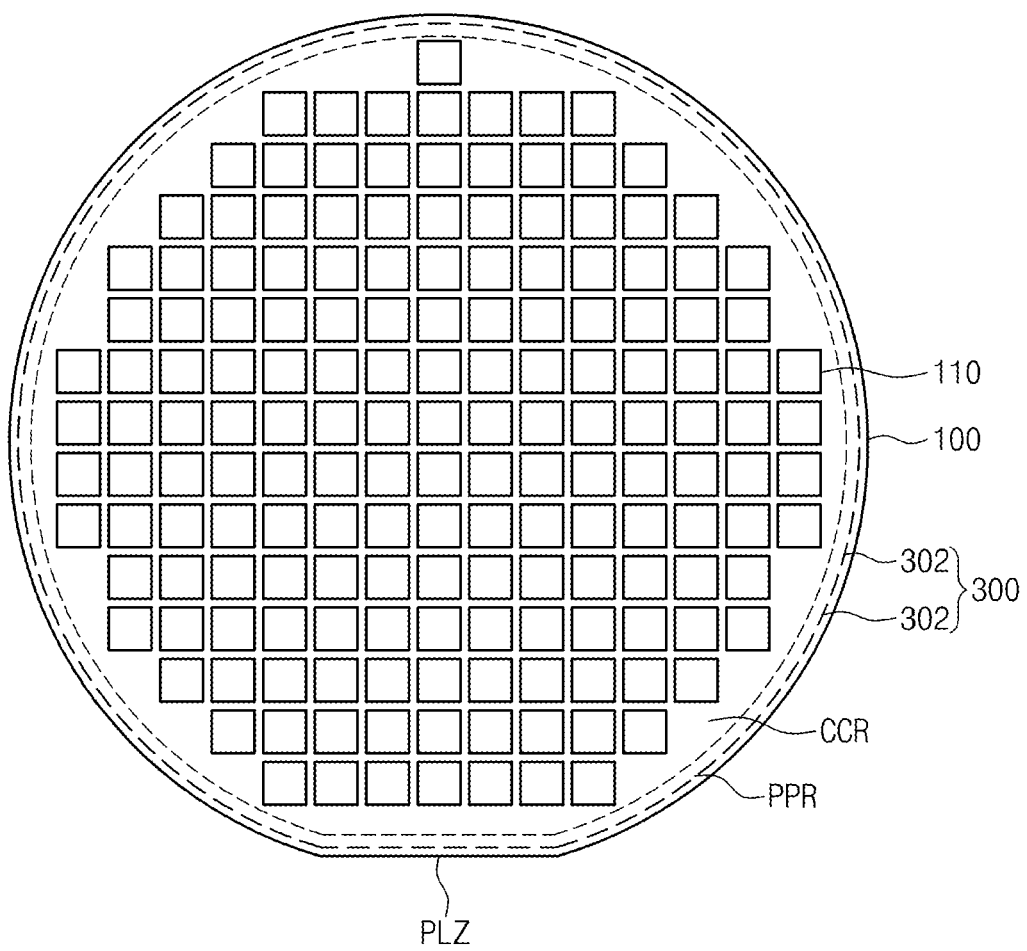
Figure 8C:
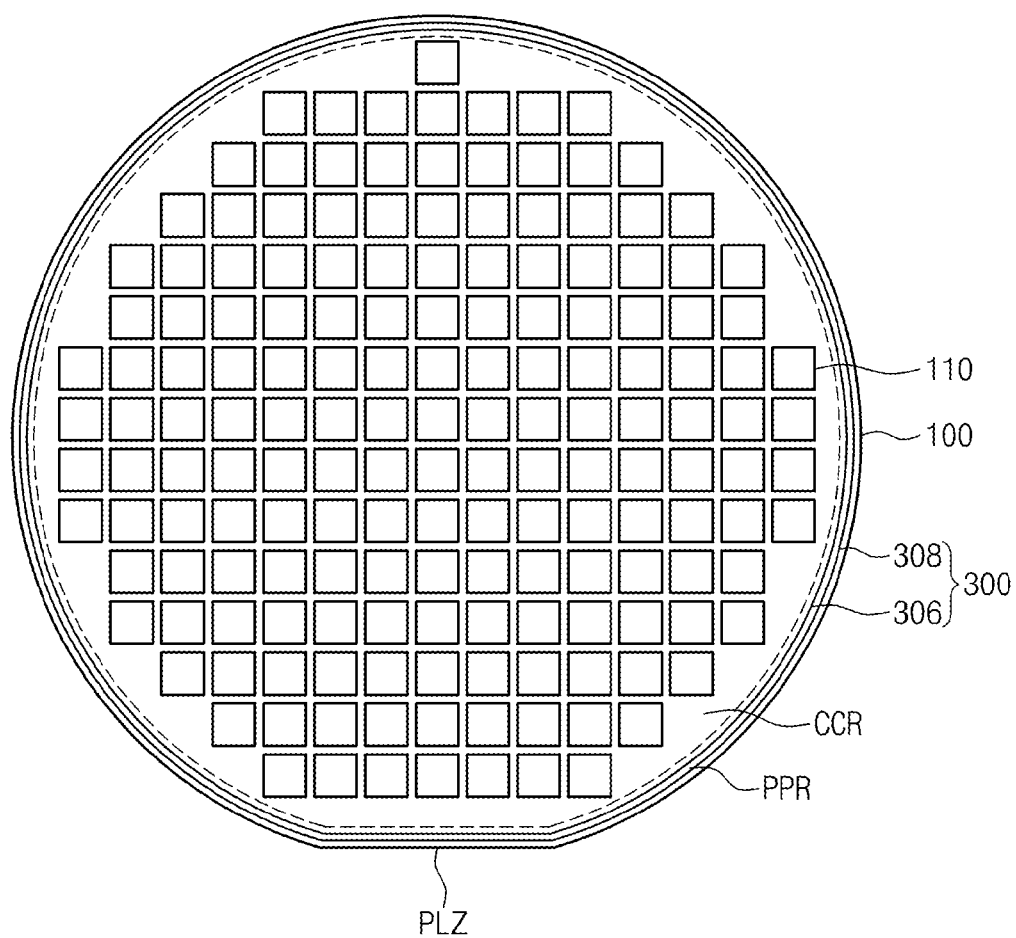

FIGS. 8A through 8C are top plan views illustrating reforming regions according to example embodiments of the inventive concepts. Referring to FIGS. 8A through 8C, an initial substrate 100 may include a flat zone PLZ to display crystal orientation.

Referring to FIG. 8A, a reforming region 300 may be in the form of a closed curve that is continuously or substantially continuously formed along an edge region PPR of the initial substrate 100. As shown in this figure, at a flat zone (PLZ) portion, the closed curve of the reforming region 300 may be in the form of a closed curve that is transformed according to the shape of the flat zone (PLZ) portion.

Referring to FIG. 8B, a reforming region 300 may include a plurality of patterns 302, and the patterns 302 may be disposed to be spaced apart from each other along an edge region PPR of an initial substrate 100 by a desired or alternatively predetermined distance.

Referring to FIG. 8C, a reforming region 300 may include a first pattern 306 and a second pattern 308. The first pattern 306 may be in the form of a closed curve that is continuously or substantially continuously formed along an edge region PPR of an initial substrate 100. The second pattern 308 may be disposed adjacent to the first pattern 306 and may be in the form of a closed curve that is continuously or substantially continuously formed along the edge region PPR of the initial substrate 100. The first and second patterns 306 and 308 may be concentric to each other.

In an example embodiment, as not shown in detail, at least one of the first and second patterns 306 and 308 may include a plurality of patterns 302 as shown in FIG. 8B. If both the first and second patterns 306 and 308 include the plurality of patterns 302, the patterns 302 may be disposed to cross each other.

Although the reforming region 300 includes the two patterns 306 and 308 in this example embodiment, the number of patterns in the reforming region is not limited in the inventive concept.

According to example embodiments of the inventive concepts, a reforming region is formed along an edge region of a substrate to protect circuit patterns in a substrate from external impact.

While the example inventive concepts have been particularly shown and described with reference to example embodiments thereof, it will be apparent to those of ordinary skill in the art that various changes in form and detail may be made therein without departing from the spirit and scope of the inventive concept, which is defined by the following claims.

What is claimed is:

1. A method of manufacturing a semiconductor device, comprising:
   preparing an initial substrate including an edge region and a central region, the central region including circuit patterns and a notch;
   forming a reforming region in the edge region of the initial substrate;
   grinding the initial substrate to form a substrate; and
   cutting the substrate to form a semiconductor chip including each of the circuit patterns,
   wherein a crystal structure of the reforming region is different from a crystal structure of the initial substrate, and
   wherein forming the reforming region in the edge region of the initial substrate includes irradiating a laser to a portion adjacent to the notch of the initial substrate.

2. The method as set forth in claim 1, wherein forming the reforming region in the edge region of the initial substrate comprises irradiating a laser along the edge region of the initial substrate.

3. The method as set forth in claim 1, wherein a depth of the reforming region is between 70 percent and 99 percent of a thickness of the initial substrate.

4. The method as set forth in claim 1, wherein the reforming region is exposed to a ground surface of the substrate.

5. The method as set forth in claim 1, wherein forming the reforming region in the edge region of the initial substrate includes substantially continuously irradiating a laser along the edge region of the initial substrate.

6. The method as set forth in claim 1, wherein forming the reforming region in the edge region of the initial substrate includes intermittently irradiating a laser along the edge region of the initial substrate to form a plurality of patterns.

7. The method as set forth in claim 1, wherein forming the reforming region in the edge region of the initial substrate comprises:
   irradiating a laser along the edge region of the initial substrate to form a first pattern; and
   irradiating the laser between the first pattern and the edge of the initial substrate to form a second pattern.

8. The method as set forth in claim 1, wherein forming the reforming region in the edge region of the initial substrate further comprises irradiating the laser along the edge region of the initial substrate.

9. A method of manufacturing a semiconductor, comprising:
   forming a substrate having a first thickness and including an edge region and a central region, the central region including a plurality of patterns and a notch;
   attaching a carrier substrate to the substrate; and
   irradiating the edge region with a laser to form a reforming region having a crystalline structure that is different from a crystalline structure of the central region,
   wherein forming the reforming region in the edge region of the initial substrate includes irradiating a laser to a portion adjacent to the notch of the initial substrate.

10. The method of claim 9, further comprising:
    grinding the substrate to a second thickness smaller than the first thickness;
    separating the carrier substrate from the substrate; and
    cutting the substrate to form a plurality of semiconductor chips.

11. The method of claim 10, wherein the plurality of semiconductor chips correspond to the plurality of patterns.

12. The method of claim 9, wherein a depth of the reforming region is between 70 percent and 99 percent of the first thickness.

13. The method of claim 9, wherein irradiating the edge region comprises substantially continuously irradiating the laser along the edge region.

14. The method of claim 9, wherein irradiating the edge region comprises intermittently irradiating the laser along the edge region.

15. The method of claim 9, wherein irradiating the edge region comprises forming a first pattern and a second pattern.

16. The method of claim 15, wherein the first pattern and the second pattern are concentric.

17. The method of claim 9, wherein the notch displays a crystal orientation of the substrate.

18. The method of claim 9, wherein irradiating the edge region comprises forming a first pattern and a second pattern, the second pattern being between the first pattern and the edge region;

the first pattern being conformal to a circumference of the substrate and to the notch; and the second pattern being formed at the notch.

19. The method of claim 18, wherein the first pattern is one of a closed curve formed along the circumference of the substrate; and a plurality of separate patterns formed along the circumference of the substrate.

* * * * *